(12) United States Patent
Wu et al.

(10) Patent No.: US 7,652,339 B2
(45) Date of Patent: Jan. 26, 2010

(54) AMBIPOLAR TRANSISTOR DESIGN

(75) Inventors: Yiliang Wu, Mississauga (CA); Beng S. Ong, Mississauga (CA); Alphonsus Hon-Chung Ng, North York (CA)

(73) Assignee: Xerox Corporation, Norwalk, CT (US)

( * ) Notice: Subject to any disclaimer, the term of this patent is extended or adjusted under 35 U.S.C. 154(b) by 235 days.

(21) Appl. No.: 11/697,604

(22) Filed: Apr. 6, 2007

(65) Prior Publication Data

US 2008/0246095 A1 Oct. 9, 2008

(51) Int. Cl.
*H01L 29/73* (2006.01)
*H01L 29/735* (2006.01)
*H01L 23/31* (2006.01)

(52) U.S. Cl. .................. 257/401; 257/369; 257/370; 257/E27.015; 257/E27.062

(58) Field of Classification Search .............. 257/401, 257/369, 370, E27.015, E27.062
See application file for complete search history.

(56) References Cited

U.S. PATENT DOCUMENTS

| | | | |
|---|---|---|---|
| 5,714,782 A * | 2/1998 | Nakagawa et al. | 257/343 |
| 6,621,099 B2 | 9/2003 | Ong et al. | |
| 6,770,904 B2 | 8/2004 | Ong et al. | |
| 6,774,393 B2 | 8/2004 | Murti et al. | |
| 2003/0160234 A1 | 8/2003 | Ong et al. | |
| 2006/0163561 A1 * | 7/2006 | Setayesh et al. | 257/40 |

OTHER PUBLICATIONS

E.J. Meijer et al., "Solution-processed ambipolar organic field-effect transistors and inverters", Nature Materials, vol. 2, 2003, pp. 678-682.
Beng S. Ong et al., "High-Performance Semiconducting Polythiophenes for Organic Thin-Film Transistors", American Chemical Society, 126, 2004, pp. 3378-3379.
Christos D. Dimitrakopoulos et al., "Organic Thin Film Transistors for Large Area Electronics", Advanced Materials, 14, No. 2, 2002, pp. 99-117.

* cited by examiner

*Primary Examiner*—Ngan Ngo
*Assistant Examiner*—Benjamin Tzu-Hung Liu
(74) *Attorney, Agent, or Firm*—Oliff & Berridge, PLC

(57) ABSTRACT

An ambipolar transistor, including a p-type semiconductor region and an n-type semiconductor region near the p-type semiconductor region. Also a first terminal and second terminal contact both the p-type semiconductor region and the n-type semiconductor region. Furthermore, the p-type semiconductor region and the n-type semiconductor region substantially do not overlap each other. A method of manufacturing an ambipolar transistor is also disclosed, including forming a p-type semiconductor region, forming an n-type semiconductor region near the p-type semiconductor region, forming a first terminal contacting both the p-type semiconductor region and n-type semiconductor region, forming a second terminal contacting both the p-type semiconductor region and n-type semiconductor region; and wherein the p-type semiconductor region and the n-type semiconductor region substantially do not overlap, and have substantially no interfacial area.

21 Claims, 11 Drawing Sheets

AMBIPOLAR TRANSISTOR DESIGN

BACKGROUND

The exemplary embodiments relate to an ambipolar thin film transistor device, and methods for producing ambipolar thin film transistor devices.

Thin film transistors (TFTs), composed of a substrate, a gate, source, and drain electrodes, a gate dielectric layer, and a semiconductor layer, are the key elements of integrated circuits (ICs). TFT fabrication using solution processes such as spin-coating, stencil/screen printing, stamping, and jet-printing, present a low-cost manufacturing alternative to conventional photolithography. In recent decades, development of solution-processed transistors, including organic thin film transistors (OTFTs), have made significant progress. There is ample evidence that they will replace traditional crystalline or amorphous silicon technology at least in certain low-cost, and or low-end applications.

Digital circuits are largely based on complimentary metal oxide semiconductor (CMOS) structures that use both p-type and n-type unipolar transistors. The advantages of CMOS circuits are lower power dissipation, greater speed, improved immunity to noise effects, and greater tolerance of variability and shifts in transistor operating characteristics. These CMOS circuits may be constructed using unipolar transistors with either p-type or n-type semiconductor.

An example of an unipolar transistor 29 is shown in FIGS. 1A and 1B. The unipolar transistor 29 includes a first terminal 4, a second terminal 5, a substrate 6, a gate electrode 7, a dielectric layer 8 and a semiconductor layer 10. The first terminal 4 may be a source electrode, while the second terminal 5 may be a drain electrode. The semiconductor layer 10 may only be either a p-type or n-type semiconductor.

In order to design more efficient circuits based on solution process transistors, there is an urgent need for complementary technology, where both p-type and n-type operations are realized in a single transistor. Such a transistor is referred to as an ambipolar transistor. Ideally, the transistor should exhibit high mobility, balanced ON current and/or balanced mobility.

SUMMARY

In the related art, there are multiple approaches to designing ambipolar transistors. One approach is to use a semiconductor material that exhibits ambipolar characteristics, where the material has good p-type and n-type behavior. However, no materials have currently been shown to have balanced both p-type and n-type mobilities. Another approach is to combine a p-type semiconductor and an n-type semiconductor in a single transistor.

In the related art, the semiconductors in the ambipolar transistor are usually arranged in either a stacked structure, or interpenetrating network of p-type and n-type semiconductors. For example, FIG. 3 shows an ambipolar transistor 1 with a stacked semiconductor structural arrangement transistors, and FIG. 2 shows an ambipolar transistor 1 with an interpenetrating network arrangement of the p-type and n-type semiconductors. In FIG. 3, an n-type semiconductor region 2 is stacked on top of a p-type semiconductor region 3 in an ambipolar transistor 1 that includes a first terminal 4, a second terminal 5, a substrate 6, a gate electrode 7, and a dielectric layer 8. Also, in FIG. 2, the p-type and n-type semiconductors are intermixed within a semiconductor layer 10 in an ambipolar transistor 1 that includes a first terminal 4, a second terminal 5, a substrate 6, a gate electrode 7, and a dielectric layer 8. In the related art, the first terminal 4 may be a source electrode, while the second terminal 5 may be a drain electrode.

The drawback of these two device designs is that there is a large interfacial area between p-type and n-type semiconductors, in which the surface areas of the p-type and n-type semiconductors overlap. A trapping effect may occur, causing the semiconductors within the ambipolar transistors to have significantly lower mobility than the semiconductors within the unipolar transistors. For example, poly[2-methoxy-5-(3',7'-dimethyloctyloxy)]-p-phenylene vinylene) ($OC_1C_{10}$-PPV) p-type semiconductor and [6,6]-phenyl C61-butyric acid methyl ester (PCBM) n-type semiconductor each show mobilities of about $10^{-2}$ $cm^2/Vs$ when each is used as an unipolar transistor. However, the mobility of these semiconductors decreases to $10^{-4}$ $cm^2/Vs$ and $10^{-5}$ $cm^2/Vs$, respectively, in ambipolar transistors with a mixture of $OC_1C_{10}$-PPV and PCBM [E. J. Meijer, et al. Nature Materials, 2003, Vol. 2, page 678.]. At these levels, the mobility is too low to have practical use for electronic devices such as electronic readers (e.g., display, electronic book, electronic newspaper, and electronic signage) or radio frequency identification tags.

To date, ambipolar transistor designs achieve neither balanced mobility nor balanced ON current. In circuit design, the lack of balanced mobility and/or balanced current results in more complicated layout of TFTs.

Therefore, there is a need to develop an ambipolar transistor that exhibits high mobility of at least about $10^{-3}$ $cm^2/Vs$. There is also a need to develop an ambipolar transistor that has balanced mobility and/or balanced ON current.

The exemplary embodiments include an ambipolar transistor with a p-type semiconductor region, an n-type semiconductor region, a first terminal, a second terminal, and a gate electrode. The p-type semiconductor region and the n-type semiconductor region both contact the first terminal and second terminal. The first terminal may be a source electrode, while the second terminal may be a drain electrode. Furthermore, the p-type region and the n-type region substantially do not overlap and have substantially no or little interfacial area.

The ambipolar transistor of the exemplary embodiments provide several advantages. First, the p-type and n-type semiconductors are separated within the transistor channel. Therefore, the interfacial area can be minimized to avoid trapping effect between each of the semiconductors. As a result, it is possible to achieve high mobility for each of the semiconductors.

Lack of balance mobility results in lack of balance in the ON current, which limits the practical application of the transistors and circuit design. The exemplary embodiments allow for use of semiconductors with different mobilities. By adjusting the channel area of the p-type and n-type semiconductor in the device, we can achieve balanced ON current for both p- and n-type operation for circuit design, even though the semiconductors have unbalanced mobilities. In one embodiment it is possible to change the channel width ratio between p-type and n-type semiconductors to balance ON current.

DETAILED DESCRIPTION OF EMBODIMENTS

Figure 1A:
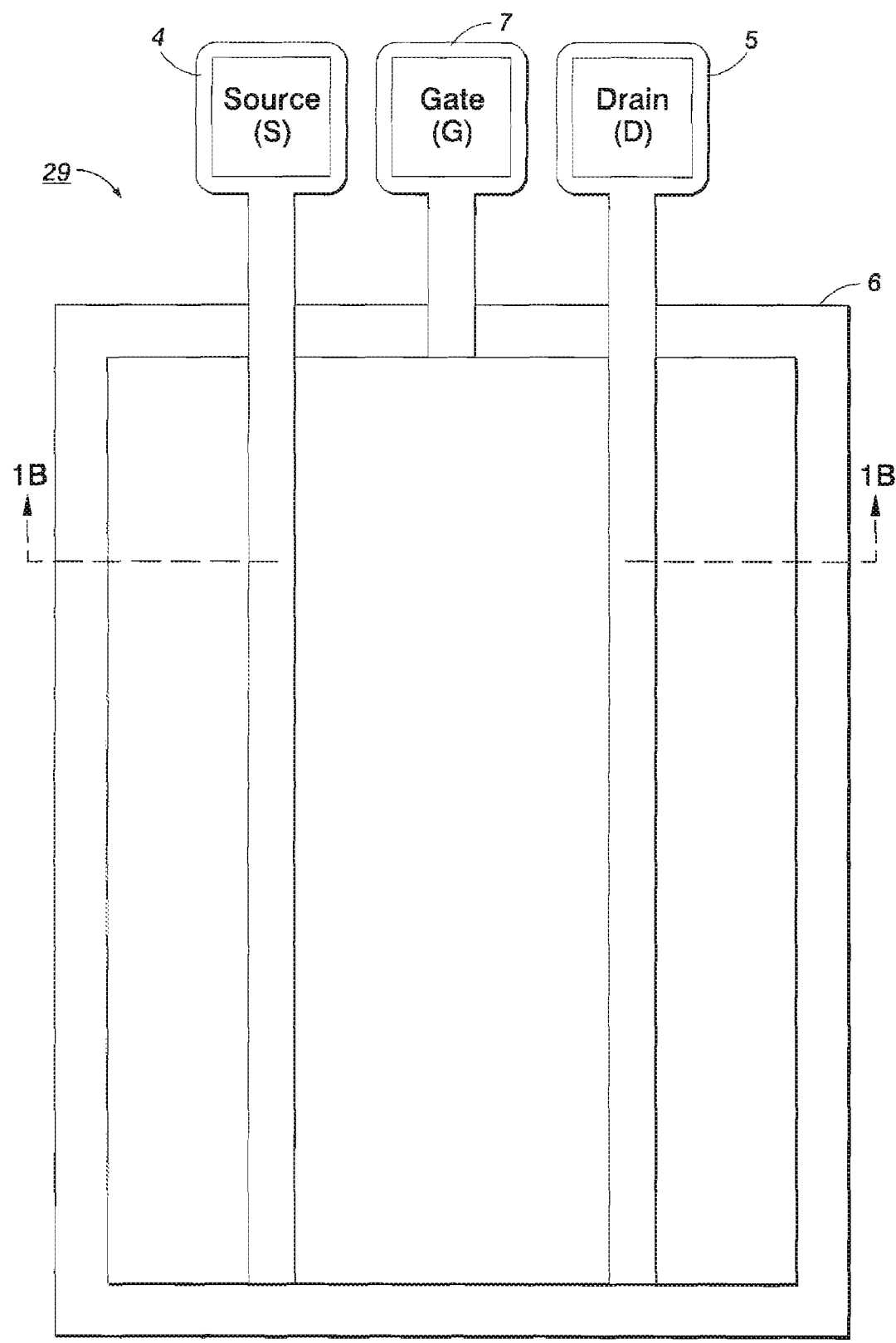
FIG. 1A shows a plan view of an unipolar transistor with source, drain, and gate electrodes in the related art.
Figure 1B:
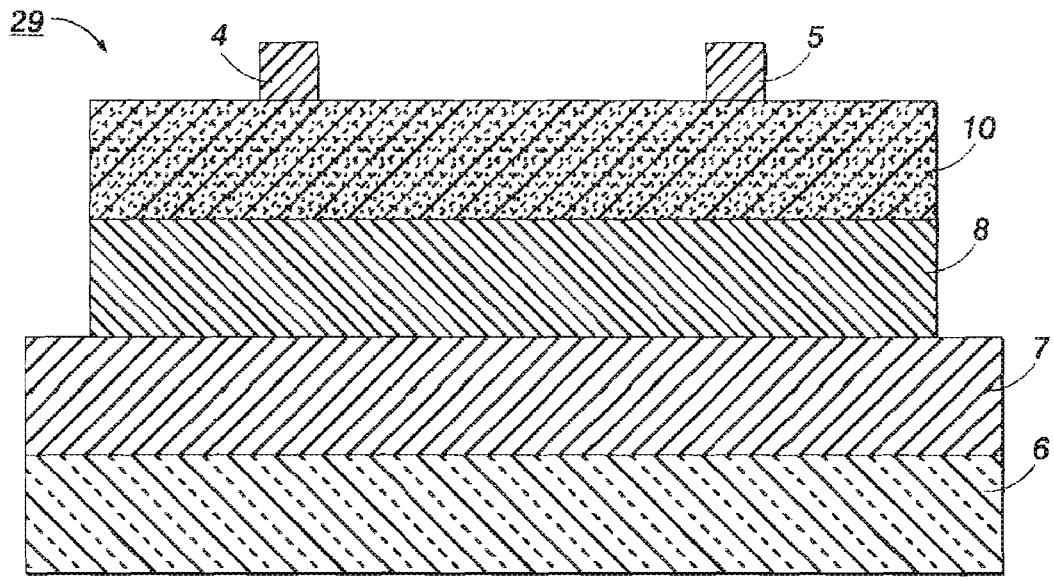
FIG. 1B shows a cross-sectional view of the unipolar transistor of FIG. 1A taken along line I-I.
Figure 2:
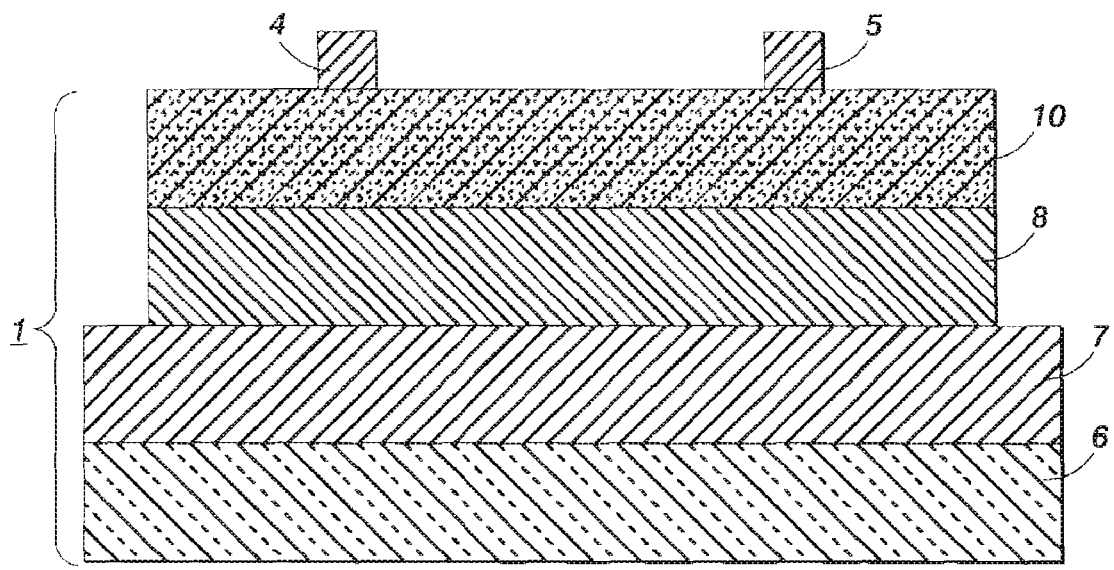
FIG. 2 shows a cross-sectional view of an ambipolar transistor with interpenetrating p-type and n-type semiconductors in the related art.
Figure 3:
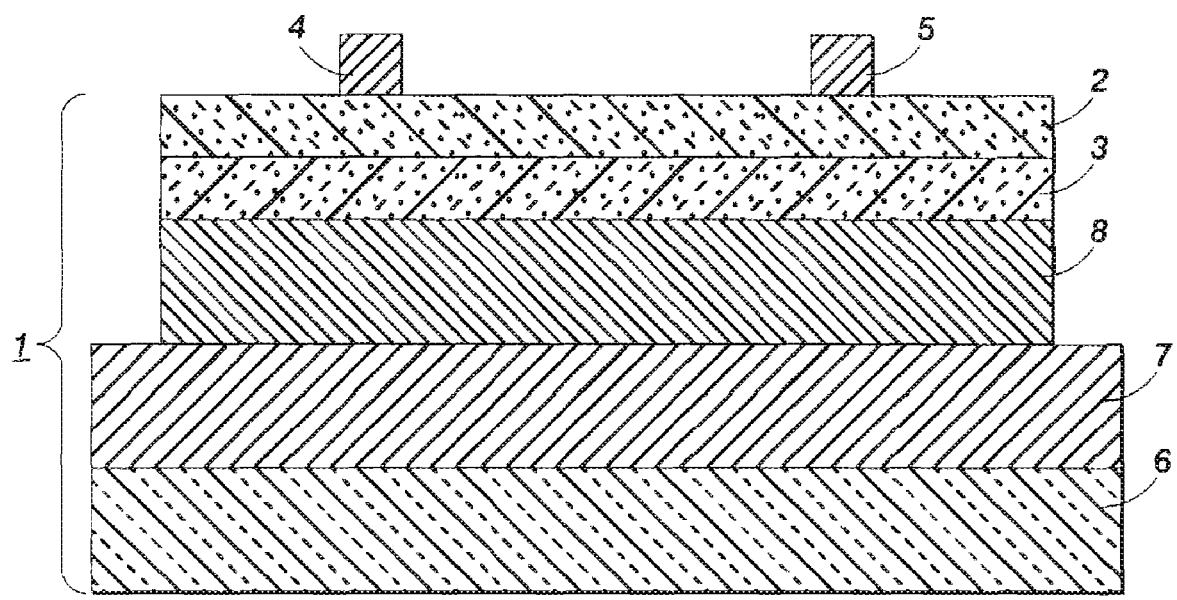
FIG. 3 shows a cross-sectional view of an ambipolar transistor with dual-layered p-type and n-type semiconductor regions in the related art.

The exemplary embodiments include an ambipolar transistor design that reduces interfacial area between p-type and n-type semiconductors, and an ambipolar transistor that can have a balanced ON current with semiconductors having a unbalanced mobility.

Aspects of the present disclosure relate to in ambipolar transistor comprising a p-type and an n-type semiconductors, wherein both semiconductors contact source and drain electrodes of the transistor, and wherein the p-type and n-type semiconductors are laterally deposited in the transistor channel.

Another aspect of the present disclosure relate to an ambipolar transistor comprising a p-type region having a p-type semiconductor, and an n-type region having an n-type semiconductor, wherein both regions contact source and drain electrodes of the ambipolar transistor, and wherein p-type region and the n-type region are substantially no overlap. The term "substantially no overlap" refers that the p-type region and the n-type region have an overlap area of less than about 50% of the total area of the p-type region and the n-type region, preferably less than 20%, and further less than 5%. In an embodiment, the ratio of the channel width of the p-type region to the channel width of n-type region is from about 9:1 to about 1:9, further from about 7:3 to about 3:7. This ratio may be varied so that the p-type region and the n-type region will have a balanced current.

Substrate

The substrate may be composed of for instance silicon, glass plate, plastic film or sheet. For structurally flexible devices, a plastic substrate, such as for example polyester, polycarbonate, polyimide sheets and the like may be preferred. The thickness of the substrate may be from about 10 micrometers to over about 10 millimeters with an exemplary thickness being from about 50 to about 100 micrometers, especially for a flexible plastic substrate and from about 1 to about 10 millimeters for a rigid substrate such as glass plate or silicon wafer.

Electrodes

The gate electrode can be a thin metal film, a conducting polymer film, a conducting film made from conducting ink or paste, or the substrate itself can be the gate electrode, for example heavily doped silicon, Examples of gate electrode materials include but are not restricted to aluminum, gold, chromium, indium tin oxide (ITO), conducting polymers such as polystyrene sulfonate-doped poly(3,4-ethylenedioxythiophene) (PSS-PEDOT), conducting ink/paste comprised of carbon black/graphite or colloidal silver dispersion in polymer binders, such as ELECTRODAG™ available from Acheson Colloids Company. The gate electrode layer can be prepared by vacuum evaporation, sputtering of metals or conductive metal oxides, coating from conducting polymer solutions or conducting inks by spin coating, casting or printing. The thickness of the gate electrode layer ranges for example from about 10 to about 200 nanometers for metal films and in the range of about 1 to about 10 micrometers for polymer conductors.

The source and drain electrode layers can be fabricated from materials which provide a low resistance ohmic contact to the semiconductor layer. Typical materials suitable for use as source and drain electrodes include those of the gate electrode materials such as gold, nickel, aluminum, platinum, conducting polymers and conducting inks. Typical thicknesses of source and drain electrodes are about, for example, from about 40 nanometers to about 10 micrometers with the more specific thickness being about 100 to about 400 nanometers.

Semiconductor Layer

Both organic semiconductors and inorganic semiconductors can be used. In an embodiment, solution processable semiconductor is preferred. Materials suitable for use as the organic semiconductor layer include acenes, such as carbon nanotubes, anthracene, tetracene, pentacene, and substituted pentacenes, perylenes, fullerenes, phthalocyanines, oligothiophenes, polythiophenes, and substituted derivatives thereof. In embodiments, the organic semiconductor layer is formed from a liquid processable material. Examples of suitable semiconductor materials include polythiophenes, oligothiophenes, and the semiconductor polymers described in U.S. application Ser. No. 10/042,342, which is published as U.S. Patent Application No. 2003/0160234, and U.S. Pat. Nos. 6,621,099, 6,774,393, and 6,770,904, the disclosures of which are incorporated herein by reference in their entireties. Additionally, suitable materials include the semiconductor polymers disclosed in "Organic Thin Film Transistors for Large Area Electronics" by C. D. Dimitrakopoulos and P. R. L. Malenfant, Adv. Mater., Vol. 12, No. 2, pp. 99-117 (2002), the disclosure of which is also incorporated herein by reference. Materials suitable for use as the inorganic semiconductor layer include for example metal oxide such as ZnO and $In_2O_3$, amorphous and crystalline silicon, silicon nanowires, and the like.

The semiconductor layer may be formed by any suitable means including but not limited to vacuum evaporation, spin coating, solution casting, dip coating, stencil/screen printing, flexography, gravure, offset printing, inkjet-printing, microcontact printing, a combination of these processes, and the like. In embodiments, the semiconductor layer is formed by a liquid deposition method. In embodiments, the semiconductor layer has a thickness of from about 10 nanometers to about 1 micrometer. In further embodiments, the organic semiconductor layer has a thickness of from about 30 to about 150 nanometers. In other embodiments, the semiconductor layer has a thickness of from about 40 to about 100 nanometers.

Gate Dielectric

The gate dielectric layer generally can be an inorganic material film or an organic polymer film. Illustrative examples of inorganic materials suitable as the gate dielectric layer include aluminum-titanium oxide (ATO), aluminum oxide, silicon oxide, silicon nitride, barium titanate, barium zirconium titanate and the like; illustrative examples of organic polymers for the gate dielectric layer include polyesters, polycarbonates, poly(vinyl phenol), polyimides, polystyrene, poly(methacrylate)s, poly(acrylate)s, epoxy resin and the like. The thickness of the gate dielectric layer is, for example, from about 10 nanometers to about 2000 nanometers depending on the dielectric constant of the dielectric material used. An representative thickness of the gate dielectric layer is from about 100 nanometers to about 500 nanometers. The gate dielectric layer may have a conductivity that is for example less than about $10^{-12}$ S/cm.

Figure 4A:
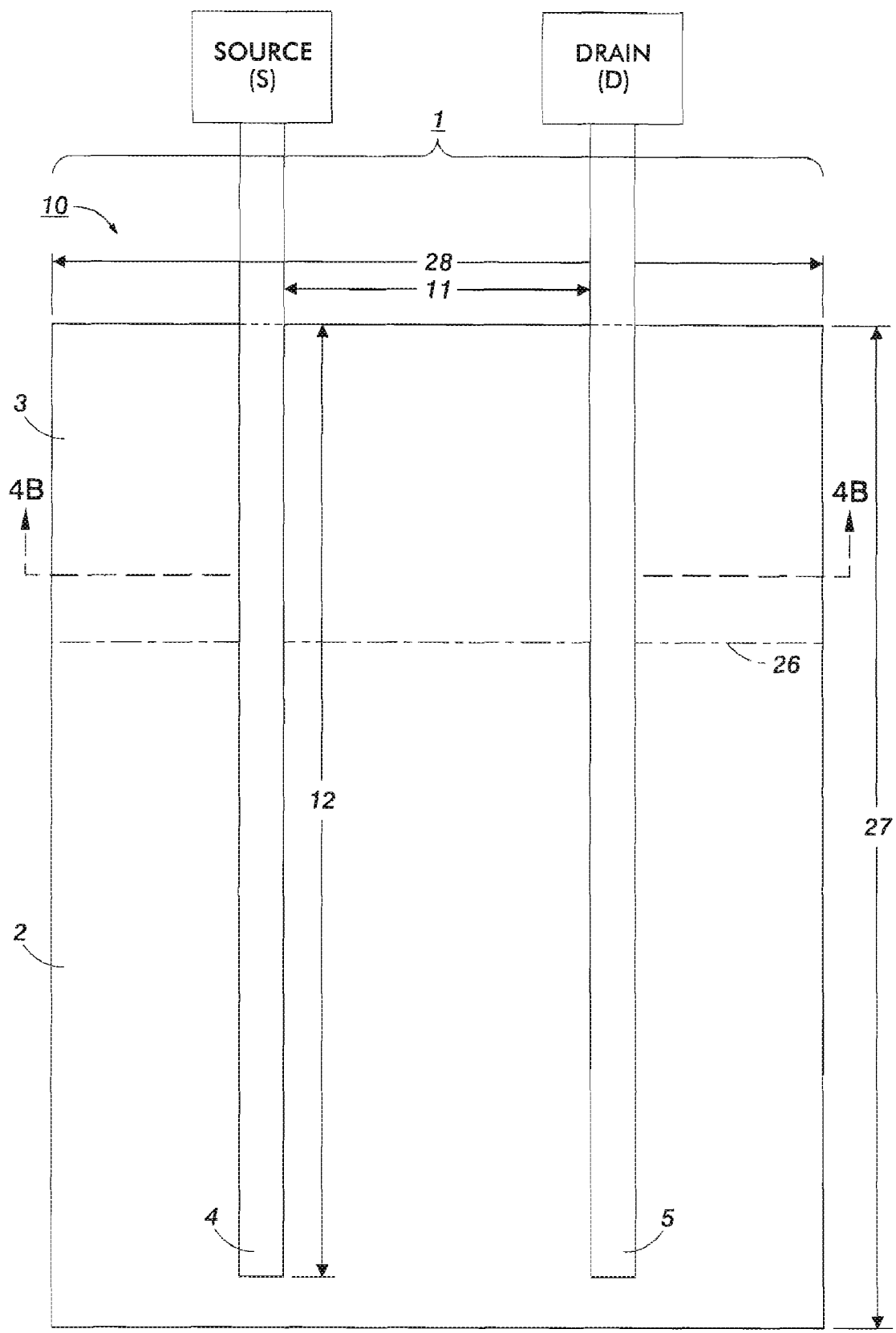
FIG. 4A shows a plan view of an ambipolar transistor with minimized interfacial area between the p-type semiconductor region and the n-type semiconductor region, and parallel electrodes in an exemplary embodiment.
Figure 4B:
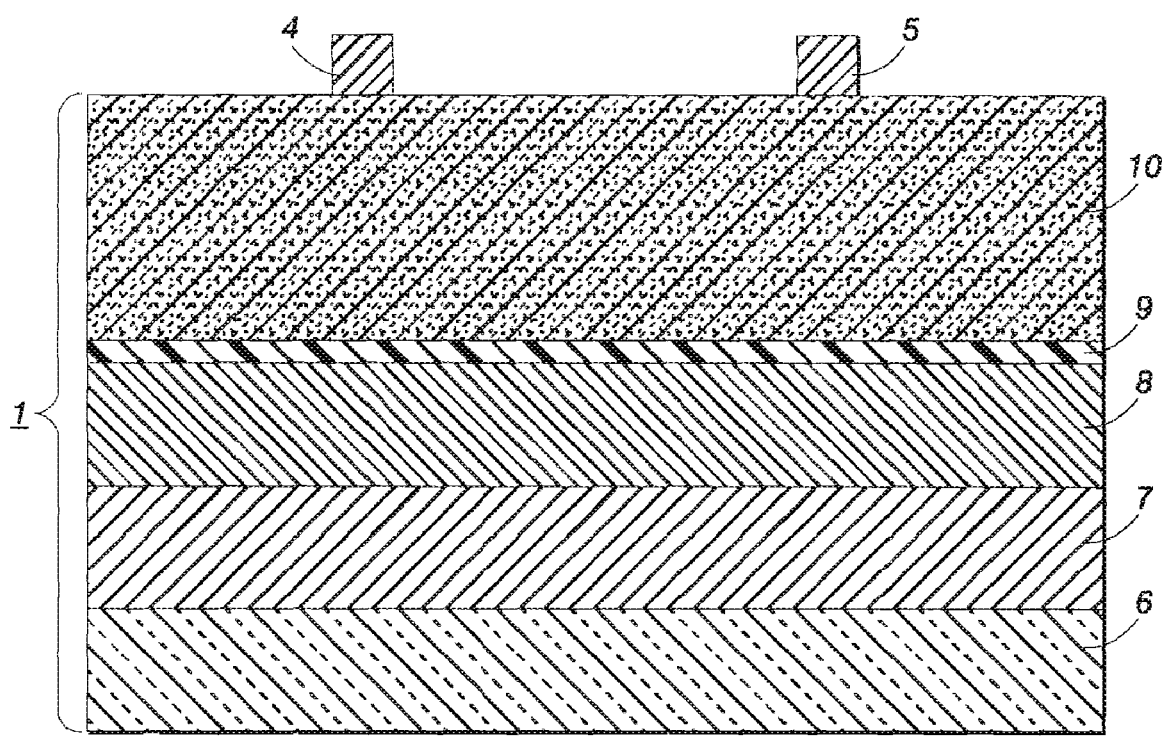
FIG. 4B shows a cross-sectional view of the ambipolar transistor of FIG. 4A taken along line 4B-4B.

Referring to FIG. 4B, an ambipolar transistor 1 has a substrate 6. A gate electrode layer 7 is formed over the substrate 6. The gate electrode layer 7 can include indium-tin oxide (ITO). A dielectric layer 8 is formed adjacent the gate electrode layer 7. The dielectric layer 8 can include aluminum-tin oxide (ATO). The dielectric layer 8 is then modified with a poly(methyl silsyesquioxane) (pMSSQ) layer 9. Afterwards, a semiconductor layer 10 is formed over the pMSSQ layer 9. Finally, both a first terminal 4 and a second terminal 5 are formed to contact the semiconductor layer 10. The first terminal 4 may be a source electrode, while the second terminal 5 may be a drain electrode.

Referring to FIG. 4A, the ambipolar transistor 1 has ambipolar transistor length 28 and ambipolar transistor width 27. Semiconductor layer 10 on the ambipolar transistor 1 includes a p-type semiconductor region 2 and an n-type semiconductor region 3. The p-type semiconductor region 2 and the n-type semiconductor 3 are laterally arranged on the ambipolar transistor. Also, the p-type semiconductor region 2 contacts the n-type semiconductor region 3 at junction 26. Each of the semiconductor regions contact both the first terminal 4 and the second terminal 5, First terminal 4 and second terminal 5 form the boundaries for a channel region. The distance between the first terminal 4 and second terminal 5 forms a channel length 11, while the length of either the first terminal 4 and second terminal 5 form a channel width 12. In the present embodiment, channel width 12 is substantially equal to the width of the ambipolar transistor width 27. Together, the channel length 11 and channel width 12 define the channel region. Junction 26 refers to the region where the two types of semiconductor meet. More specifically unction 26 is the contact between the p-type semiconductor region 2 and the n-type semiconductor region 3. In one embodiment, the junction area (overlap region of the two types of semiconductor in the channel area) is about less than 50% of the channel area, preferably less than 20% of the channel area, and further less than about 10% of the channel area. Ideally, there is little or no overlap or interfacial area between the p-type semiconductor region 2 and the n-type semiconductor region 3.

This kind of ambipolar transistor design is preferred over conventional designs because, unlike amorphous and crystalline silicon transistors, solution process transistors usually have large device dimensions. In other words, there is a large channel area, particularly for transistors with interdigitation-type source and drain electrodes, to deposit both p-type and n-type semiconductors. Also, solution process semiconductors enable inkjet patterning. With inkjet technique, it is possible to pattern different semiconductors in one transistor channel. An inkjet drop usually has a diameter of about 20 microns or less. The size is much less than the channel width of transistors. Therefore, it is capable of parallel deposition of at least two types of semiconductors into one transistor channel. In one embodiment, a p-type and an n-type semiconductor may be deposited by inkjet techniques into the channel region.

To maintain balanced ON current or balanced mobility, the channel width ratio between the p-type semiconductor region 2 and the n-type semiconductor region 3 may be adjusted. For example, the mobility of PQT-12, a p-type semiconductor, is 0.002 cm$^2$/V.s, while the mobility of zinc oxide, an n-type semiconductor, is 0.007 cm$^2$/V.s. To balance the ON current, the channel width ratio between the zinc oxide and the PQT-12 may be set to 1:4.

The ambipolar transistor 1 just described in FIGS. 4A and 4B is called a bottom-gate-ton-contact transistor. This is because the gate electrode layer 7 is formed between the substrate 6 and semiconductor layer 10 on the "bottom" of the ambipolar transistor 1, while the first terminal 4 and the second terminal 5 are formed over the semiconductor layer 10 on the "top" of the ambipolar transistor 1. However, other kinds of configurations such as bottom-gate-bottom-contact and top-gate transistors can be used.

Figure 6:
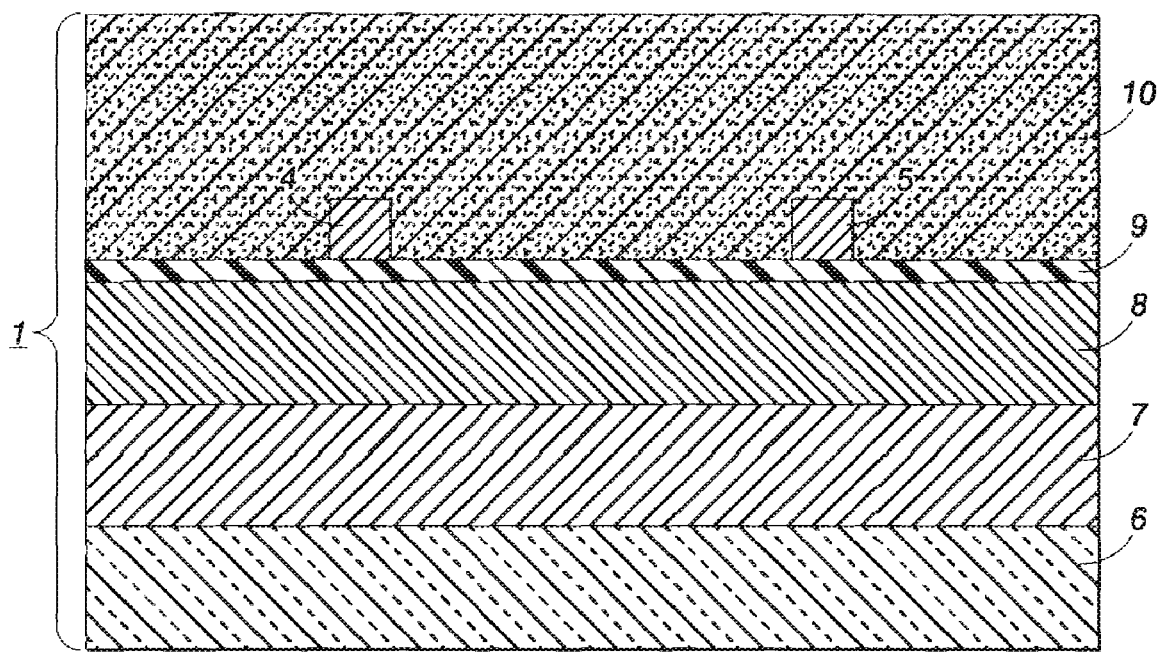
FIG. 6 shows a cross sectional view of a bottom-gate-bottom-contact ambipolar transistor with minimized interfacial area between the p-type semiconductor region and n-type semiconductor region in an exemplary embodiment.

Referring to FIG. 6, another exemplary embodiment of the current invention including a bottom-gate-bottom-contact ambipolar transistor 1 is shown. Here, the ambipolar transistor 1 has a substrate 6. The gate electrode 7 is formed over the substrate 6. The gate electrode 7 can include ITO. A dielectric layer 8 is formed adjacent the gate layer 7. The dielectric layer 8 can include ATO. The dielectric layer 8 is then modified with pMSSQ layer 9. First terminal 4 and second terminal 5 are formed over the pMSSQ layer 9. Finally, semiconductor layer 10 is formed over the first terminal 4, the second terminal 5 and the pMSSQ layer 9. More specifically, the first terminal 4 and second terminal 5 are located between the semiconductor layer 10 and the pMSSQ layer 9. In summary, the gate electrode 7, the dielectric layer 8, the pMSSQ layer 9, the first terminal 4, and the second terminal 5 are all formed between glass substrate 6 and the semiconductor layer 10.

Figure 7:
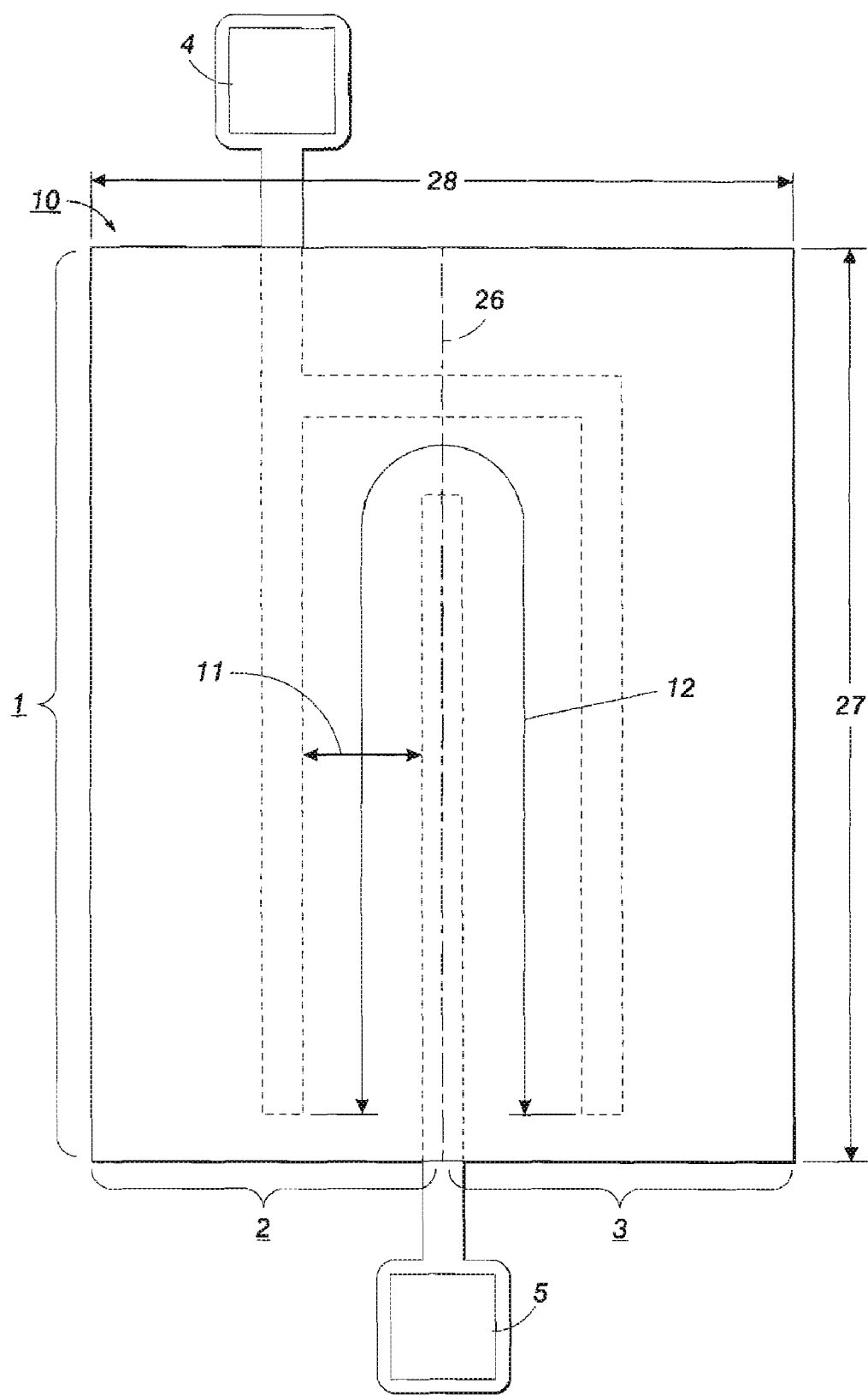
FIG. 7 shows a plan view of the ambipolar transistor with minimized interfacial area between the p-type semiconductor region and n-type semiconductor region in an exemplary embodiment.

Referring to FIG. 7, in another exemplary embodiment, a different ambipolar structure is shown. The ambipolar transistor 1 has ambipolar transistor width 27 and ambipolar transistor length 28. The semiconductor layer 10 includes a p-type semiconductor region 2 and an n-type semiconductor region 3. Junction 26, which is where the p-type semiconductor region 2 and n-type semiconductor region 3 meet, runs along the width of the ambipolar transistor 1. First terminal 4 may include a source electrode that contacts with both the p-type semiconductor region 2 and the n-type semiconductor region 3. Here the first terminal 4 first contacts the p-type semiconductor region 2 and then has a separate branch that crosses over to the n-type semiconductor region 3. Both branches run across the entire width of the ambipolar transistor 1. The second terminal 5 is arranged so as to run along the length of junction 26 and also contact both the p-type semiconductor region 2 and the n-type semiconductor region 3. First terminal 4 and second terminal 5 form the boundaries for a channel region. The distance between the first terminal 4 and second terminal 5 forms a channel length 11, while the length of the first terminal 4 form a channel width 12. The first terminal 4 and the second terminal 5 can be arranged either in a bottom-gate-top-contact configuration or in a bottom-gate-bottom-contact configuration.

Figure 8:
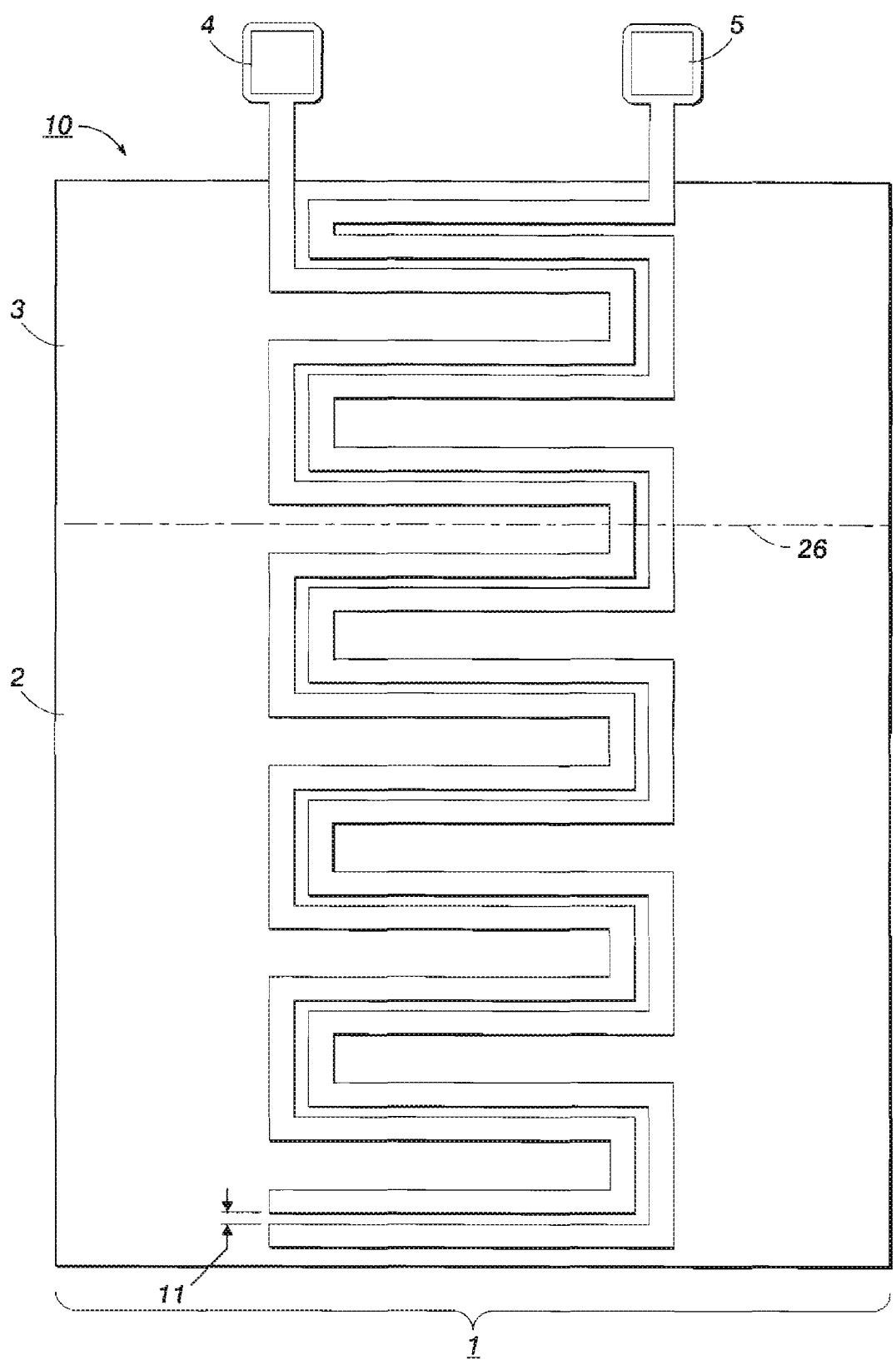
FIG. 8 shows a plan view of the ambipolar transistor with minimized interfacial area between the p-type semiconductor region and n-type semiconductor region, and with interdigitation type electrodes in an exemplary embodiment.

Referring to FIG. 8, a plan view of the ambipolar transistor 1 with minimized interfacial area contact between the p-type semiconductor region 2 and n-type semiconductor region 3 is shown, where the first terminal 4 and second terminal 5 are arranged in an interdigitation configuration. The semiconductor layer 10 includes p-type semiconductor region 2 and n-type semiconductor region 3. The p-type semiconductor region 2 and n-type semiconductor region 3 meet at junction 26. Junction 26 runs along the length of the ambipolar transistor 1. First terminal 4 is arranged so that it winds along the width of the ambipolar transistor 1. Second terminal 5 is configured so that it also winds along the width of the ambipolar transistor 1. Second terminal 5 is arranged so that it follows the winding of the first terminal 4, at a constant distance. The first terminal 4 and second terminal 5 define the channel region, where the channel length 11 is the distance between the first terminal 4 and second terminal 5. The channel width is defined either as the length of the first terminal 4 or the second terminal 5. First terminal 4 and second terminal 5 may be placed in a bottom-gate-top-contact configuration, or bottom-gate-bottom-contact configuration.

Figure 9:
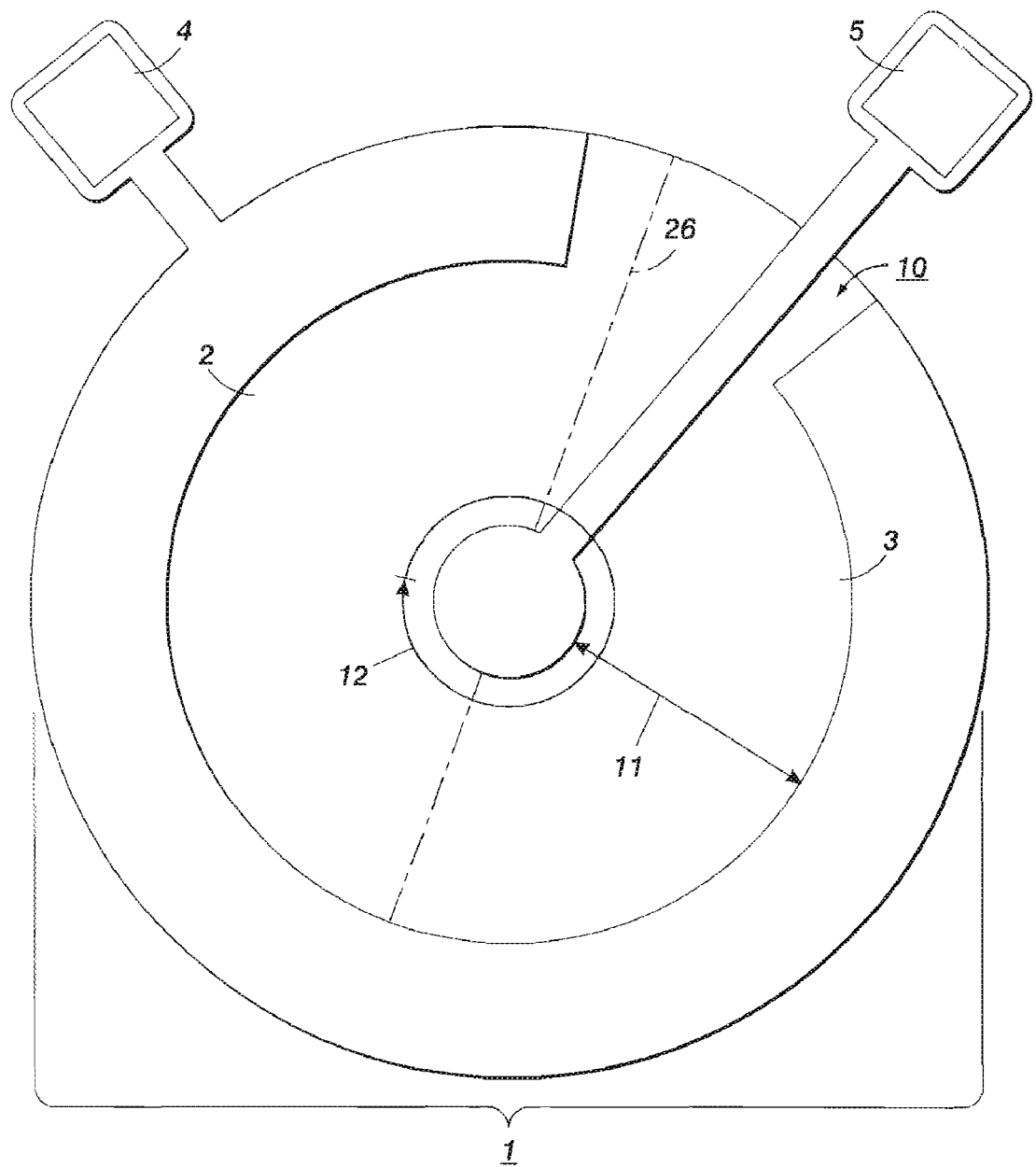
FIG. 9 shows a plan view of the ambipolar transistor with minimized interfacial area between the p-type semiconductor region and n-type semiconductor region, and with circular electrodes in an exemplary embodiment.

Referring to FIG. 9, a plan view of the ambipolar transistor 1 with minimized interfacial area contact between the p-type semiconductor region 2 and n-type semiconductor region 3, arranged in a circular manner, with a circular electrode configuration. Semiconductor layer 10 comprises p-type semiconductor region 2 and n-type semiconductor region 3. First terminal 4 is formed across the outer edge of the circular ambipolar transistor 1, while second terminal 5 is formed at the center of the circular ambipolar transistor 1. Also, both the first terminal 4 and the second terminal 5 are formed so that they each contact both p-type semiconductor region 2 and n-type semiconductor region 3. Junction 26 is formed where the p-type semiconductor region 2 and the n-type semiconductor region 3 meet. The channel length 11 is the distance of the inner radius of the first terminal 4 minus the radius of the second terminals, and the channel width 12 is the circumference of the second terminal 5.

Figure 5:
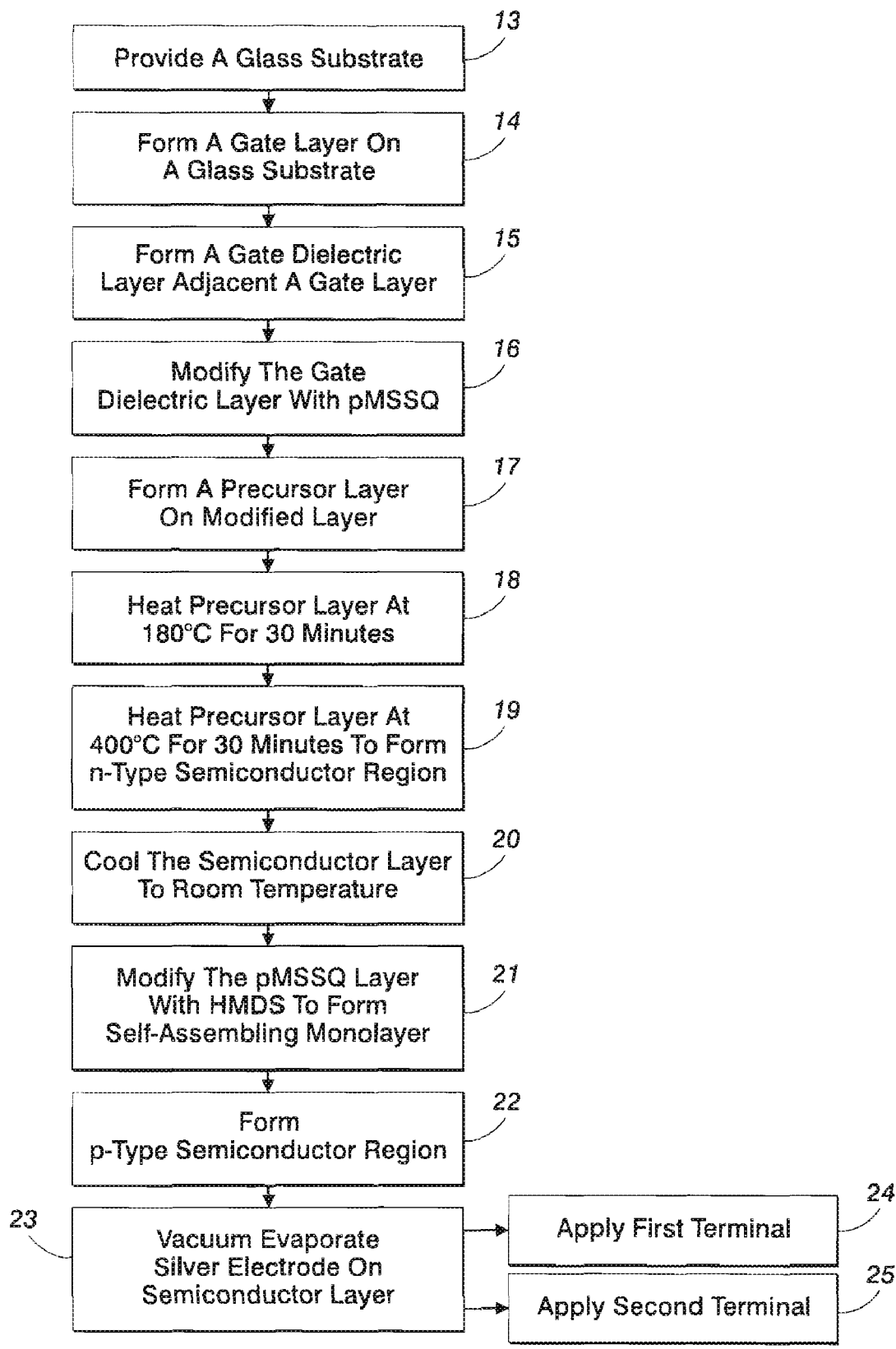
FIG. 5 shows a flow-chart of a method to form the ambipolar transistor with minimized interfacial area between the p-type semiconductor region and n-type semiconductor region in an exemplary embodiment.

FIG. 5 shows the method of making the disclosed ambipolar transistor 1. A bottom-gate-top-contact TFT was fabricated as follows. At step 13, a substrate 6 is provided first. At step 14, a gate electrode layer 7, preferably indium-tin oxide (ITO), is formed over the substrate 6. At step 15, gate dielectric layer 8, preferably an aluminum-tin oxide (ATO, 220 nm) is then formed adjacent the gate electrode layer 7. At step 16, the gate dielectric layer 8 was modified with a 50-nm poly (methyl silsesquioxane) (pMSSQ) layer 9. The pMSSQ modification improves the performance of the n-type semiconductor that will soon be placed. The surface then undergoes a plasma clean process.

The semiconductor layer 10, which may form either a p-type semiconductor region 2 or an n-type semiconductor region 3, may now be formed on the ambipolar transistor 1 so that the gate electrode layer 7 is formed between the glass substrate 6 and semiconductor layer 10. Here, the n-type semiconductor region is first formed on the ambipolar transistor 1. First, part of the pMSSQ layer 9 was covered. At step 17, approximately 0.25 M solution of zinc acetate in a mixture of ethanolamine and methoxyethanol (with Zn/amine=1 molar ratio) can be spin-coated on top of uncovered pMSSQ layer 9 to form a zinc oxide precursor layer. At step 18, the precursor layer is first heated on a hot plate at about 180° C. for about 30 minutes. At step 19, it is then placed in an oven and heated to 400° C. for 30 minutes to form an n-type zinc oxide (ZnO) semiconductor region 3. This region is known as the end cap region.

At step 20, the n-type semiconductor layer was cooled down to room temperature and the cover is now removed. Next, at step 21, the uncovered pMSSQ region 9 was modified with hexamethyldisilazane (HMDS) to form a self-assembling monolayer. At step 22, a p-type semiconductor material, preferably a poly(3,3'''-didodecyl-quaterthiophene) (PQT-12) semiconductor layer (PQT-12 is disclosed in Beng S. Ong, et.al. J. Am. Chem. Soc. 2004, 126, 3378-3379, the disclosure of which is totally incorporated herein by reference) was deposited on top of HMDS modification layer to form a p-type semiconductor region 2. At step 23, after drying and annealing, silver electrodes were vacuum evaporated over the semiconductor layer 10 to form both the first terminal 4 and second terminal 5. The first terminal 4 and second terminal 5 are then arranged in steps 24 and 25 so that each terminal contacts both the p-type semiconductor region 2 and n-type semiconductor region 3. Here, a parallel-electrode configuration was formed, as shown in FIG. 6. The first terminal 4 may include a source electrode, while the second terminal 5 may include a drain electrode.

Figure 10:
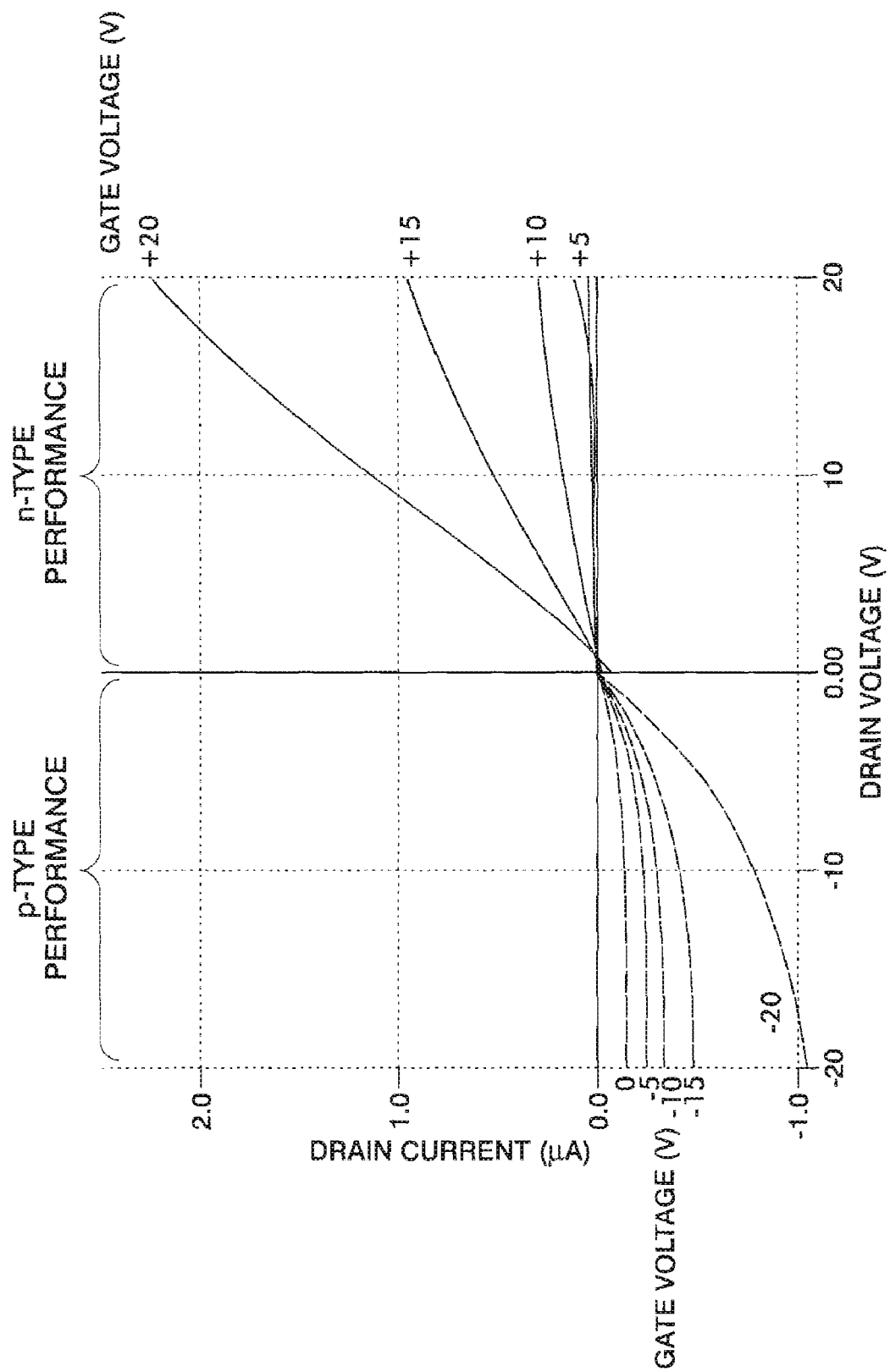
FIG. 10 shows typical output characteristics of an ambipolar transistor in an exemplary embodiment.

The characteristics of the exemplary embodiment were compared with unipolar transistors including only zinc oxide semiconductor or only PQT-12 semiconductor. FIG. 10 shows the typical output characteristics of an ambipolar transistor at different gate voltages, where the first terminal 4 and second terminal 5 are arranged in a parallel configuration. The transistor has a channel length of 90 um and a channel width of 5000 um, wherein the channel width ratio between n-type and p-type regions is 1:4.

The devices were evaluated using Keithley 4200 TFT characterization system at ambient conditions. Typical output curves of an ambipolar transistor operating under a negative and positive bias were observed (FIG. 10). The device showed strong hole and electron accumulation. The hole and electron mobilities measured in the ambipolar transistor were about 0.0028 and about 0.0072 $cm^2/Vs$, respectively. For comparison, in experiments, the unipolar transistor with similar device stricture but only PQT-12 semiconductor showed mobility of about 0.0023 $cm^2/Vs$ while the unipolar transistor with similar device stricture but only zinc oxide semiconductor only showed mobility of about 0.0073 $cm^2/Vs$. The observed mobility values for both p-type and n-type semiconductors ambipolar transistors are the same as those achieved in unipolar transistors, since there is little or no interfacial area between the p-type and n-type semiconductors. Moreover, although the mobilities of PQT and ZnO are different, by changing the channel width of each semiconductor's region, balanced ON current is achieved.

It will be appreciated that various of the above-disclosed and other features and functions, or alternatives thereof, may be desirably combined into many other different systems or applications. Also, various presently unforeseen or unanticipated alternatives, modifications, variations or improvements therein may be subsequently made by those skilled in the art which are also intended to be encompassed by the following claims.

What is claimed is:

1. An ambipolar transistor, comprising:
    a p-type semiconductor region comprising a first semiconductor material;
    an n-type semiconductor region comprising a second semiconductor material that is different from the first semiconductor material;

a first terminal contacting both the p-type semiconductor region and the n-type semiconductor region; and a second terminal contacting both the p-type semiconductor region and the n-type semiconductor region, wherein the p-type semiconductor region and the n-type semiconductor region substantially do not overlap.

2. The ambipolar transistor of claim 1, wherein the ratio of the channel width of the p-type region to the channel width of the n-type region is from about 9:1 to about 1:9 so that the p-type semiconductor region and the n-type semiconductor region have a balanced current.

3. The ambipolar transistor of claim 1, wherein the ratio of the channel width of the p-type region to the channel width of n-type region is from about 7:3 to about 3:7 so that the p-type semiconductor region and the n-type semiconductor region have a balanced current.

4. The ambipolar transistor of claim 1, wherein the p-type semiconductor region and the n-type semiconductor region have substantially no interfacial area.

5. The ambipolar transistor of claim 1, wherein the overlap area between the p-type semiconductor region and the n-type semiconductor region is less than 50% of the total area of the p-type semiconductor region and the n-type semiconductor region.

6. The ambipolar transistor of claim 1, wherein the overlap area between the p-type semiconductor region and the n-type semiconductor region is less than 5% of the total area of the p-type semiconductor region and the n-type semiconductor region.

7. The ambipolar transistor of claim 1, wherein the p-type semiconductor region and the n-type semiconductor region are laterally arranged.

8. A method of manufacturing an ambipolar transistor, comprising:

forming a p-type semiconductor region comprising a first semiconductor material;

forming an n-type semiconductor region near the p-type semiconductor region and comprising a second semiconductor material different from the first semiconductor material;

forming a first terminal; and forming a second terminal wherein both the first terminal and the second terminal contact both the p-type semiconductor region and the n-type semiconductor region, and wherein the p-type semiconductor region and the n-type semiconductor region substantially do not overlap.

9. The method of claim 8, wherein the p-type semiconductor region is formed by inkjet printing a p-type semiconductor composition.

10. The method of claim 8, wherein both the p-type semiconductor region and the n-type semiconductor region are formed by inkjet printing.

11. The method of claim 8, wherein the overlap area between the p-type semiconductor region and the n-type semiconductor region is less than 20% of the total area of the p-type semiconductor region and the n-type semiconductor region.

12. The method of claim 8, further comprising modifying the gate dielectric layer with poly-methyl silsequinoxane.

13. The method of claim 12, further comprising forming a precursor layer on the modified gate dielectric layer.

14. The method of claim 13, wherein the p-type semiconductor region comprises a polythiophene semiconductor.

15. The method of claim 13, wherein the forming the n-type semiconductor region further includes:

heating a precursor layer at about 180° Celsius for about 30 minutes;

cooling the precursor layer to room temperature; and re-heating the precursor layer at about 400° Celsius for about 30 minutes to form the n-type semiconductor region.

16. The method of claim 8, wherein the p-type semiconductor region and the n-type semiconductor region have substantially no interfacial area.

17. The method of claim 8, further comprising:

laterally arranging the p-type semiconductor region and the n-type semiconductor region with respect to each other.

18. A system for manufacturing a circuit with a plurality of ambipolar transistors, the system comprising:

means for forming a p-type semiconductor region comprising a first semiconductor material;

means for forming an n-type semiconductor region near the p-type semiconductor region and comprising a second semiconductor material that is different from the first semiconductor material;

means for forming a first terminal contacting both the p-type semiconductor region and the n-type semiconductor region; and means for forming a second terminal contacting both the p-type semiconductor region and the n-type semiconductor region, wherein the p-type semiconductor region and the n-type semiconductor region have substantially no overlap.

19. The system of claim 18, wherein both the p-type semiconductor and the n-type semiconductor are solution processable semiconductors, the p-type semiconductor being an organic semiconductor, and the n-type semiconductor being an inorganic semiconductor.

20. The system of claim 18, wherein the p-type semiconductor is a polythiophene and the n-type semiconductor is a metal oxide.

21. The system of claim 18, wherein the p-type semiconductor region and the n-type semiconductor region are laterally arranged.

* * * * *